United States Patent
Chiu (10) Patent No.: US 10,418,395 B2
(45) Date of Patent: Sep. 17, 2019

(54) METHODS OF FORMING IMAGE SENSOR INTEGRATED CIRCUIT PACKAGES

(71) Applicant: SEMICONDUCTOR COMPONENTS INDUSTRIES, LLC, Phoenix, AZ (US)

(72) Inventor: Jui Yi Chiu, Taichung (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 72 days.

(21) Appl. No.: 15/459,228

(22) Filed: Mar. 15, 2017

(65) Prior Publication Data

US 2017/0186792 A1    Jun. 29, 2017

Related U.S. Application Data

(62) Division of application No. 14/586,225, filed on Dec. 30, 2014, now Pat. No. 9,634,059.

(51) Int. Cl.
*H01L 27/146* (2006.01)

(52) U.S. Cl.
CPC .. *H01L 27/14618* (2013.01); *H01L 27/14636* (2013.01); *H01L 27/14687* (2013.01); *H01L 2224/11* (2013.01); *H01L 2224/94* (2013.01)

(58) Field of Classification Search
CPC ......... H01L 27/14687; H01L 27/14618; H01L 27/146369; H01L 27/14698
See application file for complete search history.

(56) References Cited

U.S. PATENT DOCUMENTS

| | | | |
|---|---|---|---|
| 8,093,674 B2 | 1/2012 | Tu et al. | |
| 8,153,508 B2 | 4/2012 | Kim | |
| 8,692,358 B2 | 4/2014 | Huang et al. | |
| 2002/0027296 A1 | 3/2002 | Badehi | |
| 2004/0077121 A1 | 4/2004 | Maeda et al. | |
| 2008/0197438 A1 | 8/2008 | Chan et al. | |
| 2009/0085134 A1* | 4/2009 | Park ................. | H01L 27/14618 257/432 |
| 2009/0166784 A1* | 7/2009 | Honda .............. | H01L 27/14618 257/432 |
| 2011/0024861 A1 | 2/2011 | Tu et al. | |
| 2011/0189808 A1 | 8/2011 | Watanabe et al. | |

(Continued)

*Primary Examiner* — Brigitte A Paterson
(74) *Attorney, Agent, or Firm* — Treyz Law Group, P.C.; Joseph F. Guihan (57) ABSTRACT

A method of forming image sensor packages may include performing a molding process. Mold material may be formed either on a transparent substrate in between image sensor dies, or on a removable panel in between transparent substrates attached to image sensor dies. Redistribution layers may be formed before or after the molding process. Mold material may be formed after forming redistribution layers so that the mold material covers the redistribution layers. In these cases, holes may be formed in the mold material to expose solder pads on the redistribution layers. Alternatively, redistribution layers may be formed after the molding process and the redistribution layers may extend over the mold material. Image sensor dies may be attached to a glass or notched glass substrate with dam structures. The methods of forming image sensor packages may result in hermetic image sensor packages that prevent exterior materials from reaching the image sensor.

8 Claims, 7 Drawing Sheets

(56) References Cited

U.S. PATENT DOCUMENTS

2011/0291215 A1* 12/2011 Tu ..................... H01L 27/14618
                                                            257/433
2012/0306038 A1* 12/2012 Chow ............... H01L 27/14636
                                                            257/434
2014/0070349 A1    3/2014 Oganesian

* cited by examiner

METHODS OF FORMING IMAGE SENSOR INTEGRATED CIRCUIT PACKAGES

This application is a division of patent application Ser. No. 14/586,225, filed Dec. 30, 2014, which is hereby incorporated by reference herein in its entirety. This application claims the benefit of and claims priority to patent application Ser. No. 14/586,225, filed Dec. 30, 2014.

BACKGROUND

This relates generally to imaging systems and, more particularly, to imaging systems having image sensor integrated circuit packages.

Modern electronic devices such as cellular telephones, cameras, and computers often use digital image sensors. Imagers (i.e., image sensors) often include a two-dimensional array of image sensing pixels. Each pixel typically includes a photosensitive element such as a photodiode that receives incident photons (light) and converts the photons into electrical signals.

In a typical arrangement, an image sensor die includes an image sensor integrated circuit formed on a front surface of the image sensor die and electrical contacts (e.g., a grid of solder balls) formed on a rear surface of the image sensor die. Through-silicon vias are used to electrically connect the image sensor integrated circuit on the front surface of the image sensor die to the electrical contacts on the rear surface of the image sensor die. The image sensor die is then mechanically and electrically coupled to a printed circuit board by soldering the electrical contacts on the rear surface of the image sensor die to the printed circuit board.

There are a number of disadvantages associated with this type of packaging arrangement. In particular, the image sensing pixels and other internal electronic components may not be sufficiently protected from external elements such as dirt, dust, and water. The performance of the image sensing pixels and the image sensor as a whole may be compromised if external elements are allowed to enter an image sensor package. For example, water that leaks into an image sensor package may decrease performance of the image sensor or cease the image sensor from functioning entirely.

It would therefore be desirable to provide improved ways of forming image sensor integrated circuit packages.

DETAILED DESCRIPTION

Electronic devices such as digital cameras, computers, cellular telephones, and other electronic devices include image sensors that gather incoming image light to capture an image. An image sensor may include an array of imaging pixels. The imaging pixels may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
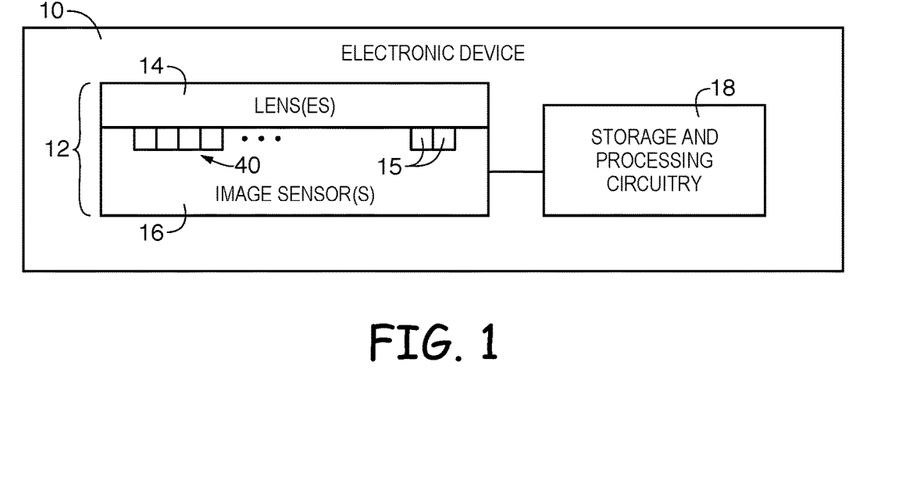
FIG. 1 is a diagram of an illustrative imaging system having a camera module that includes one or more image sensors in accordance with an embodiment of the present invention.

FIG. 1 is a diagram of an illustrative electronic device that uses one or more image sensors to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 using lens 14. Image sensor 16 may provide corresponding digital image data to processing circuitry 18. If desired, camera module 12 may be provided with an array of lenses 14 and an array of corresponding image sensors 16. Each image sensor 16 may include an image pixel array 40 with an array of image sensor pixels 15. Image sensors 16 may include one or more backside illumination (BSI) image sensors and/or one or more front side illumination (FSI) image sensors.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
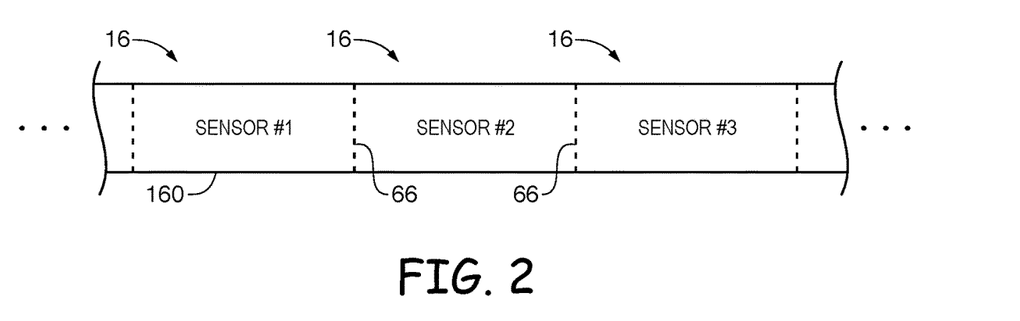
FIG. 2 is a diagram of an illustrative image sensor wafer having multiple image sensors in accordance with an embodiment of the present invention.

FIG. 2 shows an illustrative image sensor wafer 160 having a plurality of image sensor dies 16 (e.g., sensor #1, sensor #2, sensor #3, etc.). Each image sensor die 16 may include an array of image sensor pixels operable to produce image data (e.g., still or video data). During wafer dicing operations, wafer 160 may be cut along lines 66 to dice wafer 160 into individual image sensor dies 16. A singulated image sensor die may form part of a camera module that includes a single image sensor die 16 or may form part of an array camera that includes an array of image sensor dies 16.

In arrangements where image sensor dies 16 are used in an array camera, image sensor dies 16 need not be singulated from the other image sensor dies 16 in the array camera. For example, sensor #1, sensor #2, and sensor #3 may be singulated from the remaining image sensors in wafer 160 but may, if desired, remain together as one piece (e.g., a single image sensor die with three image pixel arrays). This is, however, merely illustrative. If desired, image sensors that form part of an array camera may be singulated into individual die (with one image pixel array per image sensor die) and then mounted adjacent to one another on a common printed circuit board in the array camera.

Image sensor 16 may be a backside illumination image sensor or may be a front side illumination image sensor. In a front side illumination image sensor, circuitry such as metal interconnect circuitry may be interposed between the microlens array and the photosensitive regions of the image sensor. In a backside illumination image sensor, the photosensitive regions are interposed between the microlens array and the metal interconnect circuitry of the image sensor.

Figure 3:
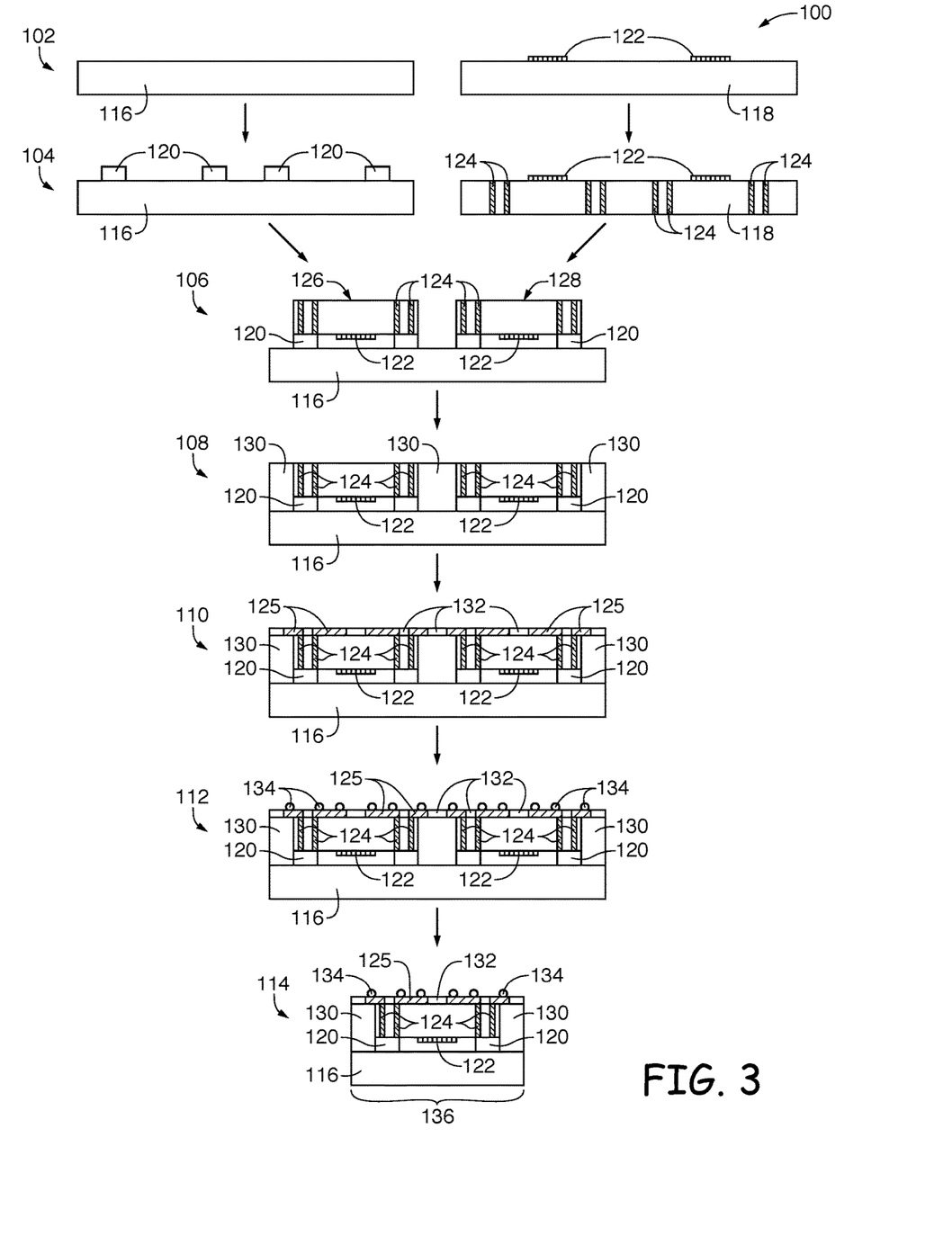
FIG. 3 is a cross-sectional diagram of an illustrative method for forming image sensor packages including a molding process and subsequently forming a redistribution layer in accordance with an embodiment of the present invention.

FIG. 3 shows an illustrative method 100 for making image sensor packages that include image sensors such as image sensor 16. At step 102, a substrate 116 and a wafer 118 may be provided. Wafer 118 may be made of silicon and may include one or more pixel arrays 122. Each pixel array may correspond to a different sensor. For example, a first pixel array may be used in a first image sensor such as sensor #1 in FIG. 2, and a second pixel array may be used in a second image sensor such as sensor #2 in FIG. 2. In FIG. 3, wafer 118 is shown with two pixel arrays, but this example is merely illustrative. Wafer 118 may have one pixel array, two pixel arrays, ten pixel arrays, hundreds of pixel arrays, or more than hundreds of pixel arrays. Wafer 118 may include an image sensor integrated circuit or multiple image sensor integrated circuits on the same side of the wafer as pixel arrays 122.

Substrate 116 may be formed from a transparent glass sheet, a clear plastic layer, or other suitable transparent member. If desired, substrate 116 may be non-transparent or may be only partially transparent. For example, substrate 116 may transmit certain ranges of wavelengths while blocking other ranges of wavelengths, if desired. In arrangements where image sensor 16 is used for analyzing fluids (e.g., for capturing images of a substance during a photochemical reaction), it may desirable for substrate 116 to be completely or partially opaque (as an example). In general, substrate 116 may have any desired transmission spectrum. Arrangements where substrate 116 is transparent are sometimes described herein as an illustrative example. Depending on the process, substrate 116 may be in wafer form or panel form.

At step 104, dams 120 are attached to substrate 116. Dams 120 may be attached to substrate 116 using any desired methods or materials. For example, dams 120 may be attached to substrate 116 using adhesive, glue, epoxy, polymer, or any other desired material. In certain embodiments, dams 120 may be formed from an adhesive material. Also at step 104, vias 124 may be formed in wafer 118. Vias 124 may provide a vertical electrical connection that passes completely through wafer 118. In embodiments where wafer 118 is made of silicon, vias 124 may be known as through-silicon vias (TSV). Vias 124 may be electrically connected to an image sensor integrated circuit.

Dams 120 may be formed from any desired material and have any desired dimensions. Dams 120 may, for example, be a photodefinable adhesive such as a dry film adhesive that can be applied and patterned using photolithographic techniques. In FIG. 3, substrate 116 is shown with four attached dams. This example is merely illustrative. Substrate 116 may be attached to one dam, two dams, ten dams, hundreds of dams, or more than hundreds of dams. Substrate 116 may be attached to any desired number of dams for each sensor die in wafer 118. For example, substrate 116 may be attached to two dams for each sensor die in wafer 118.

At step 106, wafer 118 may be sawed to form sensor dies 126 and 128. Wafer 118 may be sawed in a manner similar to that described in FIG. 2. Each sensor die may be attached to dams 120. Each sensor die may be attached to two dams, with one dam on each side of the sensor die. The sensor dies may be attached to the dams using adhesive, glue, epoxy, polymer, or any other desired material. In embodiments where dams 120 are made of an adhesive material, the sensor dies may be attached to the dams without using an additional material.

At step 108, a molding process may be performed to fill in the gap between sensor dies. Mold 130 may fill in the gap between sensor dies 126 and 128 and may fill the areas to the sides of sensor dies 126 and 128. As shown in FIG. 3, sensor die 126 may have a side closest to substrate 116 that is attached to dams 120. The side that is furthest from substrate 116, which may subsequently be referred to as the top surface, may be left exposed during the molding process. Consequently, the portions of vias 124 on the top surface may also be left exposed during the molding process. Dams 120 may prevent mold 130 from reaching pixel arrays 122.

The molding process at step 108 may consist of dispensing a liquid compound, compression molding, or any other desired molding process. In embodiments where a liquid compound is used for the molding, the liquid compound may be poured in between each sensor die. The liquid compound may fill in all areas without penetrating through dams 120. The liquid compound may later be cured to provide a hermetic seal that prevents outside materials from reaching pixel array 122. In embodiments where compression molding is used, a mold material such as plastic may be heated at a suitable temperature for a suitable length of time. The mold material may then be compressed in between sensor dies and left to cure, effectively providing a hermetic seal in between the sensor dies.

At step 110, vias 124 may be provided with redistribution layers 125. While vias may extend vertically through dies 126 and 128, redistribution layers 125 may be conductive layers that connect to vias 124 and extend horizontally across the top surface of dies 126 and 128. Redistribution layers 125 may extend horizontally past the edge of dies 126 and 128 and onto mold 130. Redistribution layers 125 may be formed with a seed layer of conductive material such as a metal. The seed layer may be titanium, titanium-tungsten, copper, or any other desired conductive material. Redistribution layers 125 may then have a conductive material such as a metal plated on the seed layer. The plated conductive material may be copper, nickel, aluminum, or any other desired conductive material. Passivation layer 132 may be formed to protect redistribution layers 125. Passivation layer 132 may be formed from a polymer, polyimide (PI), polybenzoxazole (PBO), benzocyclobuten (BCB), solder mask material, or any other desired material. Redistribution layers 125 may extend the amount of area available for forming solder connections. Redistribution layers 125 may have solder pads that may later receive solder to form mechanical and electrical connections to a printed circuit board. The solder pads may be tin-lead plated copper pads, silver plated copper pads, gold plated copper pads, or any other desired type of solder pad.

At step 112, solder 134 may be formed on redistribution layers 125. Solder balls 134 are formed on the top surface of silicon dies 126 and 128. In certain embodiments, solder balls 134 may be used to electrically connect through-silicon vias 124 to bond pads on a printed circuit board. Solder balls 134 may be located on solder pads on redistribution layers 125.

At step 114, substrate 116 and mold 130 may be cut to separate dies 126 and 128. The resulting image sensor package 136 uses mold 130 and passivation layer 132 to ensure a durable hermetic package. Image sensor package 136 may have opposing top and bottom surfaces with first and second opposing side surfaces connecting the top and bottom surfaces. The entire bottom surface of image sensor package 136 may be formed from substrate 116. The top surface of image sensor package 136 may have portions that are formed from redistribution layers 125, portions that are formed from passivation layer 132, and portions that are formed from solder 134. The side surfaces of image sensor package 136 may have portions that are formed from substrate 116, portions that are formed from mold material 130, and portions that are formed from passivation layer 132.

Figure 4:
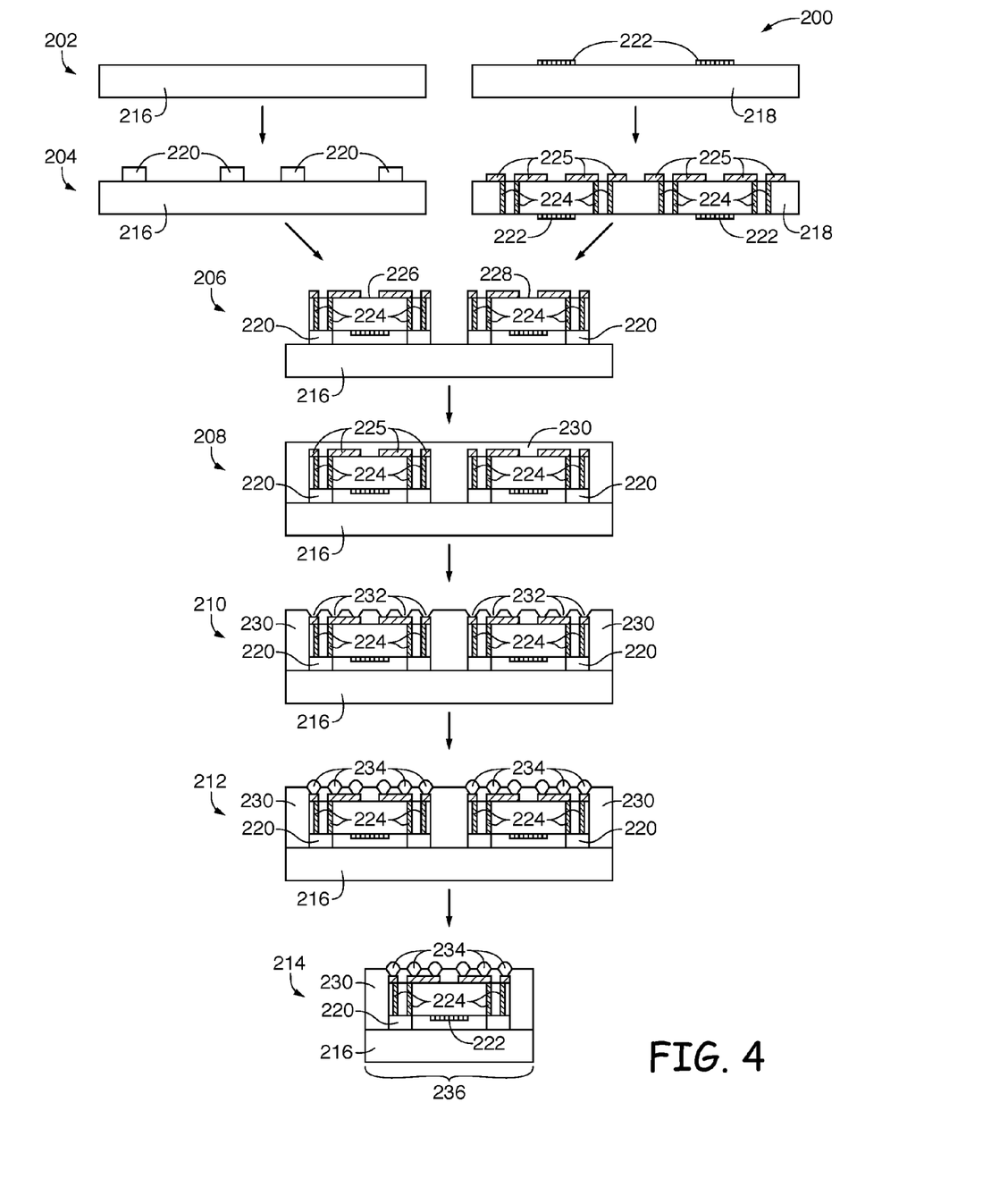
FIG. 4 is a cross-sectional diagram of an illustrative method for forming image sensor packages including forming a redistribution layer and subsequently performing a molding process in accordance with an embodiment of the present invention.

FIG. 4 shows an illustrative method 200 for making image sensor packages including image sensors such as image sensor 16. At step 202, a substrate 216 and wafer 218 may be provided. Wafer 218 may be made of silicon and may include one or more pixel arrays 222. Each pixel array may correspond to a different sensor. For example, a first pixel array may be used in a first image sensor such as sensor #1 in FIG. 2, and a second pixel array may be used in a second image sensor such as sensor #2 in FIG. 2. In FIG. 4, wafer 218 is shown with two pixel arrays, but this example is merely illustrative. Wafer 218 may have one pixel array, two pixel arrays, ten pixel arrays, hundreds of pixel arrays, or more than hundreds of pixel arrays. Wafer 218 may include an image sensor integrated circuit or multiple image sensor integrated circuits on the same side of the wafer as pixel arrays 222.

Substrate 216 may be formed from a transparent glass sheet, a clear plastic layer, or other suitable transparent member. If desired, substrate 216 may be non-transparent or may be only partially transparent. For example, substrate 216 may transmit certain ranges of wavelengths while blocking other ranges of wavelengths, if desired. In arrangements where image sensor 16 is used for analyzing fluids (e.g., for capturing images of a substance during a photochemical reaction), it may desirable for substrate 216 to be completely or partially opaque (as an example). In general, substrate 216 may have any desired transmission spectrum. Arrangements where substrate 216 is transparent are sometimes described herein as an illustrative example.

At step 204, dams 220 are attached to substrate 216. Dams 220 may be attached to substrate 216 using any desired methods or materials. For example, dams 220 may be attached to substrate 216 using adhesive, glue, epoxy, polymer, or any other desired material. Also at step 204, vias 224 may be formed in wafer 218. Vias 224 may provide a vertical electrical connection that passes completely through wafer 218. In embodiments where wafer 218 is made of silicon, vias 224 may be known as through-silicon vias (TSV). Vias 224 may be electrically connected to an image sensor integrated circuit.

At step 204, vias 224 may be provided with redistribution layers 225. While vias 224 may extend vertically through waver 218, redistribution layers 225 may be conductive layers that connect to vias 224 and extend horizontally across the top surface of wafer 218. Redistribution layers 225 may be formed with a seed layer of conductive material such as a metal. The seed layer may be titanium, titanium-tungsten, copper, or any other desired conductive material. Redistribution layers 225 may then have a conductive material such as a metal plated on the seed layer. The plated conductive material may be copper, nickel, aluminum, or any other desired conductive material. Redistribution layers 225 may extend the amount of area available for forming solder connections. Redistribution layers 225 may have solder pads for forming solder connections. The solder pads may be tin-lead plated copper pads, silver plated copper pads, gold plated copper pads, or any other desired type of solder pad.

Dams 220 may be formed from any desired material and have any desired dimensions. In FIG. 4, substrate 216 is shown with four attached dams. This example is merely illustrative. Substrate 216 may be attached to one dam, two dams, ten dams, hundreds of dams, or more than hundreds of dams. Substrate 216 may be attached to any desired number of dams for each sensor die in wafer 218. For example, substrate 216 may be attached to two dams for each sensor die in wafer 218.

At step 206, wafer 218 may be sawed to form sensor dies 226 and 228. Wafer 218 may be sawed in a manner similar to that described in FIG. 2. Each sensor die may be attached to dams 220. Each sensor die may be attached to two dams, with one dam on each side of the sensor die. The sensor dies may be attached to the dams using adhesive, glue, epoxy, polymer, or any other desired material. In certain embodiments, dams 220 may be formed from an adhesive material. In embodiments where dams 220 are formed from an adhesive material, the transparent substrate may be attached to the dams without using an additional material. Similarly, the sensor dies may be attached to the dams without using an additional material.

At step 208, a molding process may be performed to encapsulate the sensor dies and fill in the gaps between the sensor dies. Mold 230 may fill in the gap between sensor dies 226 and 228 and may fill the areas to the sides of sensor dies 226 and 228. As shown in FIG. 4, sensor die 226 may have a side closest to substrate 216 that is attached to dams 220. The side that is furthest from substrate 216, which may subsequently be referred to as the top surface, may be entirely covered by mold 230 during the molding process. Similarly, the redistribution layers 225 may be entirely covered by mold 230 during the molding process. The mold may have a planar top surface after step 208. Dams 220 may prevent mold 230 from reaching pixel arrays 222.

The molding process at step 208 may consist of dispensing a liquid compound, compression molding, or any other desired molding process. In embodiments where a liquid compound is used for the molding, the liquid compound may be poured in between each sensor die. The liquid compound may fill in all areas without penetrating through dams 220. The liquid compound may later be cured to provide a hermetic seal that prevents outside materials from reaching pixel array 222. In embodiments where compression molding is used, a mold material such as plastic may be heated at a suitable temperature for a suitable length of time. The mold material may then be compressed in between sensor dies and left to cure, effectively providing a hermetic seal in between the sensor dies.

At step 210, mold vias 232 may be formed on the top surface of mold 230. The mold vias 232 may expose solder pads on the top surfaces of the redistributed layers 225. Mold vias 232 may be formed using a laser drilling process or any other desired process. In the laser drilling process, a laser is used to make vias 232 in mold 230.

At step 212, solder 234 may be formed in mold vias 232 on redistribution layers 225. Solder balls 234 are formed on the top surface of silicon dies 226 and 228. In certain embodiments, solder balls 234 may be used to electrically connect through-silicon vias 224 to bond pads on a printed circuit board. Solder balls 234 may be located on solder pads on redistribution layers 225.

At step 214, substrate 216 and mold 230 may be cut to separate dies 226 and 228. The resulting image sensor package 236 uses mold 230 to ensure a durable hermetic package. Image sensor package 236 may have opposing top and bottom surfaces with first and second opposing side surfaces connecting the top and bottom surfaces. The entire bottom surface of image sensor package 236 may be formed from substrate 216. The top surface of image sensor package 236 may have portions that are formed from mold material 230 and portions that are formed from solder 134. The side surfaces of image sensor package 236 may have portions that are formed from substrate 216 and portions that are formed from mold material 230.

Figure 5:
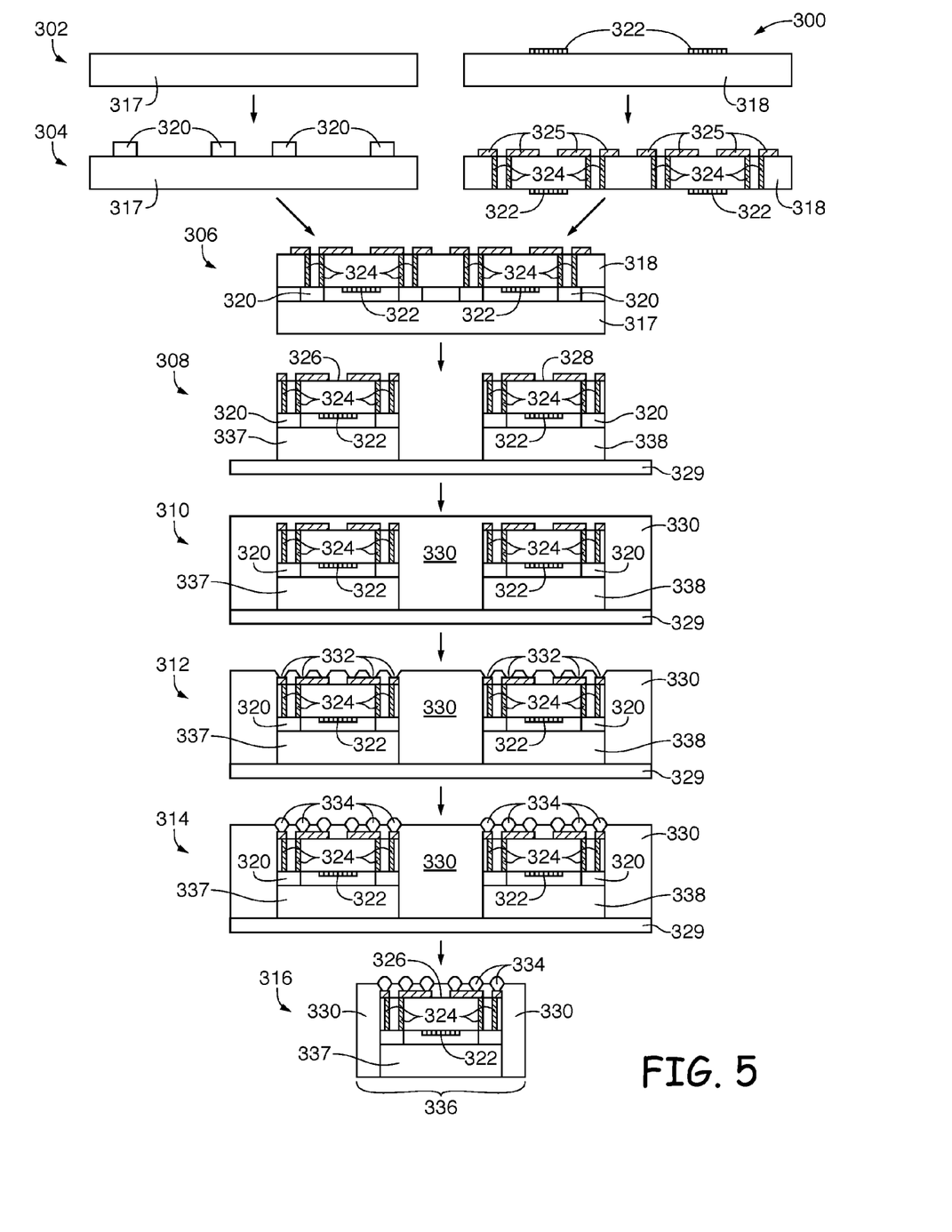
FIG. 5 is a cross-sectional diagram of an illustrative method for forming image sensor packages including using a removable panel in accordance with an embodiment of the present invention.

FIG. 5 shows an illustrative method 300 for making image sensor packages including image sensors such as image sensor 16. At step 302, a substrate 317 and wafer 318 may be provided. Wafer 318 may be made of silicon and may include one or more pixel arrays 322. Each pixel array may correspond to a different sensor. For example, a first pixel array may be used in a first image sensor such as sensor #1 in FIG. 2, and a second pixel array may be used in a second image sensor such as sensor #2 in FIG. 2. In FIG. 5, wafer 318 is shown with two pixel arrays, but this example is merely illustrative. Wafer 318 may have one pixel array, two pixel arrays, ten pixel arrays, hundreds of pixel arrays, or more than hundreds of pixel arrays. Wafer 318 may include an image sensor integrated circuit or multiple image sensor integrated circuits on the same side of the wafer as pixel arrays 322.

Substrate 317 may be formed from a transparent glass sheet, a clear plastic layer, or other suitable transparent member. If desired, substrate 317 may be non-transparent or may be only partially transparent. For example, substrate 317 may transmit certain ranges of wavelengths while blocking other ranges of wavelengths, if desired. In arrangements where image sensor 16 is used for analyzing fluids (e.g., for capturing images of a substance during a photochemical reaction), it may desirable for substrate 317 to be completely or partially opaque (as an example). In general, substrate 317 may have any desired transmission spectrum. Arrangements where substrate 317 is transparent are sometimes described herein as an illustrative example.

At step 304, dams 320 are attached to substrate 317. Dams 320 may be attached to substrate 317 using any desired methods or materials. For example, dams 320 may be attached to substrate 317 using adhesive, glue, epoxy, polymer, or any other desired material. Also at step 304, vias 324 may be formed in wafer 318. Vias 324 may provide a vertical electrical connection that passes completely through wafer 318. In embodiments where wafer 318 is made of silicon, vias 324 may be known as through-silicon vias (TSV). Vias 324 may be electrically connected to an image sensor integrated circuit.

At step 304, vias 324 may be provided with redistribution layers 325. While vias 324 may extend vertically through waver 318, redistribution layers 325 may be conductive layers that connect to vias 324 and extend horizontally across the top surface of wafer 318. Redistribution layers 325 may be formed with a seed layer of conductive material such as a metal. The seed layer may be titanium, titanium-tungsten, copper, or any other desired conductive material. Redistribution layers 325 may then have a conductive material such as a metal plated on the seed layer. The plated conductive material may be copper, nickel, aluminum, or any other desired conductive material. Redistribution layers 325 may extend the amount of area available for forming solder connections. Redistribution layers 325 may have solder pads for forming solder connections. The solder pads may be tin-lead plated copper pads, silver plated copper pads, gold plated copper pads, or any other desired type of solder pad.

Dams 320 may be formed from any desired material and have any desired dimensions. In FIG. 5, substrate 317 is shown with four attached dams. This example is merely illustrative. Substrate 317 may be attached to one dam, two dams, ten dams, hundreds of dams, or more than hundreds of dams. Substrate 317 may be attached to any desired number of dams for each sensor die in wafer 318. For example, substrate 317 may be attached to two dams for each sensor die in wafer 318.

At step 306, wafer 318 may be attached to dams 320. Wafer 318 may be attached to dams 320 such that each sensor die is attached to two dams, with one dam on each side of the sensor die. Wafer 318 may be attached to the dams using adhesive, glue, epoxy, polymer, or any other desired material. At step 306, wafer 318 has yet to be separated into individual sensor dies. In certain embodiments, dams 320 may be formed from an adhesive material. In embodiments where dams 320 are formed from an adhesive material, the transparent substrate may be attached to the dams without using an additional material. Similarly, the sensor dies may be attached to the dams without using an additional material. In certain embodiments, substrate 317 may be a wafer that proceeds in a wafer bonding process with wafer 318.

At step 308, wafer 318 and substrate 317 may be separated to form sensor dies 326 and 328 which each are attached to a separate portion of substrate 317. For example, sensor die 326 may be attached to portion 337 of substrate 317 and sensor die 328 may be attached to portion 338 of substrate 317. After being separated, substrate portions 337 and 338 may be attached to panel 329. Sensor dies 326 and 328 may be separated by sawing, cutting, or any other desired method. Panel 329 may be temporarily attached to substrate portions 337 and 338. Panel 329 may be made of a polymer or any other desired material. Depending on the process, panel 329 may be in wafer form or panel form.

At step 310, a molding process may be performed to encapsulate the sensor dies and fill in the gaps between the sensor dies. Mold 330 may fill in the gap between sensor dies 326 and 328 and may fill the areas to the sides of sensor dies 326 and 328. Similarly, mold 330 may fill in the gap between substrate portions 337 and 338 and may fill the areas to the sides of substrate portions 337 and 338. As shown in FIG. 5, sensor die 326 may have a side closest to substrate 337 that is attached to dams 320. The side that is furthest from substrate 337, which may subsequently be referred to as the top surface, may be entirely covered by mold 330 during the molding process. Similarly, the redistribution layers 325 may be entirely covered by mold 330 during the molding process. The mold may have a planar top surface after step 310. Dams 320 may prevent mold 330 from reaching pixel arrays 322.

The molding process at step 310 may consist of dispensing a liquid compound, compression molding, or any other desired molding process. In embodiments where a liquid compound is used for the molding, the liquid compound may be poured in between each sensor die. The liquid compound may fill in all areas without penetrating through dams 320. The liquid compound may later be cured to provide a hermetic seal that prevents outside materials from reaching pixel array 322. In embodiments where compression molding is used, a mold material such as plastic may be heated at a suitable temperature for a suitable length of time. The mold material may then be compressed in between sensor dies and left to cure, effectively providing a hermetic seal in between the sensor dies.

At step 312, mold vias 332 may be formed on the top surface of mold 330. The mold vias 332 may expose solder pads on the top surfaces of the redistributed layers 325. Mold vias 332 may be formed using a laser drilling process or any other desired process. In the laser drilling process, a laser is used to make vias 332 in mold 330.

At step 314, solder 334 may be formed in mold vias 332 on redistribution layers 325. Solder balls 334 are formed on the top surface of silicon dies 326 and 328. In certain embodiments, solder balls 334 may be used to electrically connect through-silicon vias 324 to bond pads on a printed circuit board. Solder balls 334 may be located on solder pads on redistribution layers 325.

At step 316, panel 329 may be removed. Panel 329 may be removed using any desired process. Mold 330 may then be cut to separate dies 326 and 328. Image sensor package 336 may have opposing top and bottom surfaces with first and second opposing side surfaces connecting the top and bottom surfaces.

In certain embodiments, image sensor package 336 may be diced such that no molding material remains on the left and right sides of sensor die 326 or substrate portion 337. In these embodiments, the entire bottom surface of image sensor package 336 may be formed from substrate portion 337. The top surface of image sensor package 336 may be have portions that are formed from mold material 330 and portions that are formed from solder 334. The side surfaces of image sensor package 336 may have portions that are formed from substrate 337, portions that are formed from dams 320, portions that are formed from sensor die 326, portions that are formed from redistribution layers 325, and portions that are formed from mold material 330.

In certain embodiments, only one cut may be made in between sensor dies 326 and 328 (e.g., FIG. 5). In these embodiments, the bottom surface of image sensor package 336 may have portions formed from substrate portion 337 and portions formed from mold material 330. The top surface of image sensor package 336 may be have portions that are formed from mold material 330 and portions that are formed from solder 334. The side surfaces may be formed entirely from mold material 330.

Figure 6:
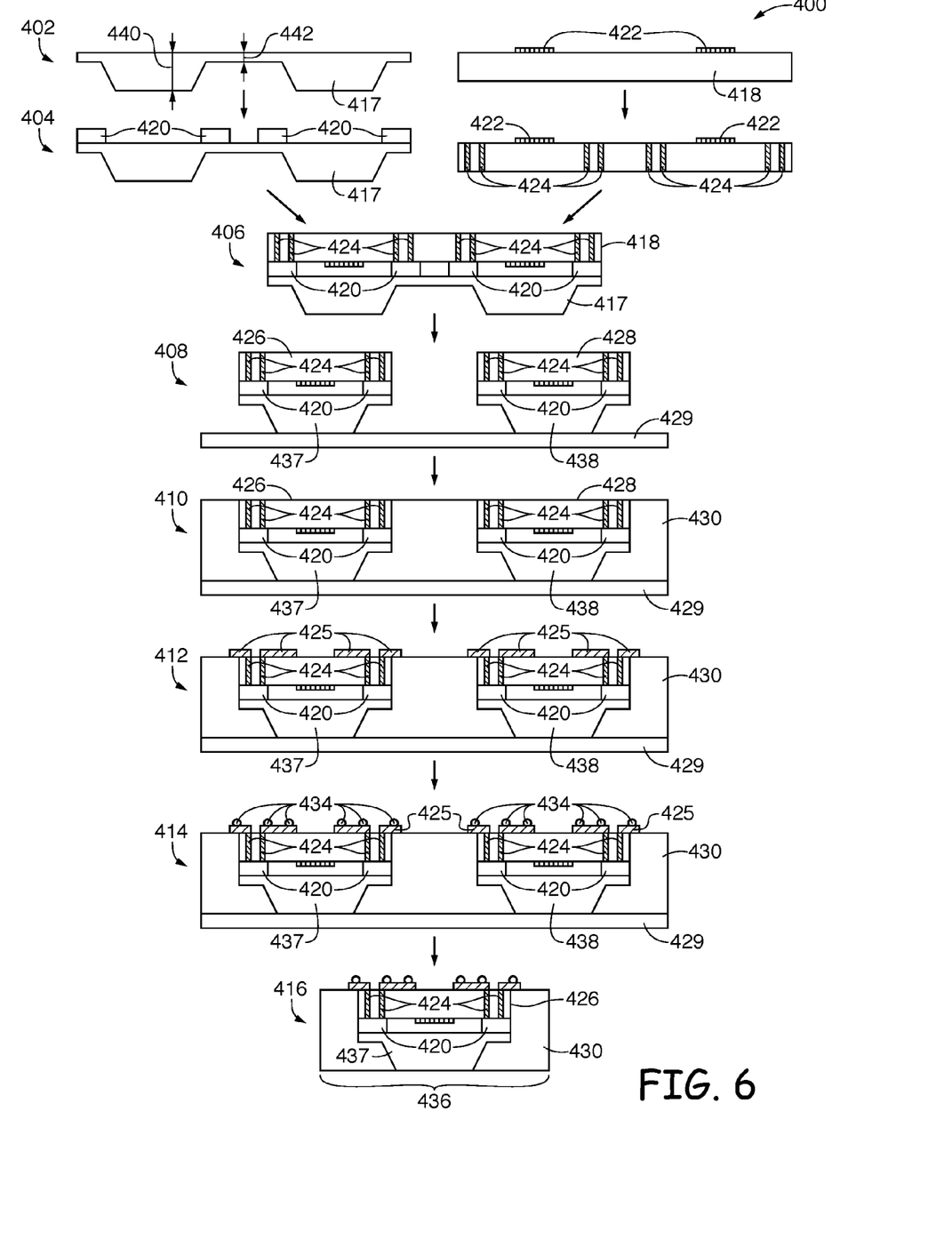
FIG. 6 is a cross-sectional diagram of an illustrative method for forming image sensor packages including using a notched substrate and a removable panel in accordance with an embodiment of the present invention.

FIG. 6 shows an illustrative method 400 for making image sensor packages including image sensors such as image sensor 16. At step 402, a notched substrate 417 and a wafer 418 may be provided. Wafer 418 may be made of silicon and may include one or more pixel arrays 422. Each pixel array may correspond to a different sensor. For example, a first pixel array may be used in a first image sensor such as sensor #1 in FIG. 2, and a second pixel array may be used in a second image sensor such as sensor #2 in FIG. 2. In FIG. 6, wafer 418 is shown with two pixel arrays, but this example is merely illustrative. Wafer 418 may have one pixel array, two pixel arrays, ten pixel arrays, hundreds of pixel arrays, or more than hundreds of pixel arrays. Wafer 418 may include an image sensor integrated circuit or multiple image sensor integrated circuits on the same side of the wafer as pixel arrays 422. Depending on the process, notched substrate 417 may be in wafer form or panel form.

Notched substrate 417 may be formed from a transparent glass sheet, a clear plastic layer, or other suitable transparent member. If desired, notched substrate 417 may be non-transparent or may be only partially transparent. For example, notched substrate 417 may transmit certain ranges of wavelengths while blocking other ranges of wavelengths, if desired. In arrangements where image sensor 16 is used for analyzing fluids (e.g., for capturing images of a substance during a photochemical reaction), it may desirable for notched substrate 417 to be completely or partially opaque (as an example). In general, notched substrate 417 may have any desired transmission spectrum. Arrangements where notched substrate 417 is transparent are sometimes described herein as an illustrative example.

Notched substrate 417 may have a first thickness 440 at the portions without notches. Notched substrate 417 may have a second thickness 442 at the notched portions. The second thickness may be less than the first thickness. The first and second thicknesses may be less than a micron, less than a millimeter, less than a centimeter, greater than a centimeter, or any other desired thickness. The notches in notched substrate 417 may be formed by wet etching, dry etching, a laser grooving process or any other desired process.

At step 404, dams 420 are attached to notched substrate 417. Dams 420 may be attached to notched substrate 417 using any desired methods or materials. For example, dams 420 may be attached to notched substrate 417 using adhesive, glue, epoxy, polymer, or any other desired material. Also at step 404, vias 424 may be formed in wafer 418. Vias 424 may provide a vertical electrical connection that passes completely through wafer 418. In embodiments where wafer 418 is made of silicon, vias 424 may be known as through-silicon vias (TSV). Vias 424 may be electrically connected to an image sensor integrated circuit.

Dams 420 may be formed from any desired material and have any desired dimensions. In FIG. 6, notched substrate 417 is shown with four attached dams. This example is merely illustrative. Notched substrate 417 may be attached to one dam, two dams, ten dams, hundreds of dams, or more than hundreds of dams. Substrate 417 may be attached to any desired number of dams for each sensor die in wafer 418. For example, substrate 417 may be attached to two dams for each sensor die in wafer 418.

At step 406, wafer 418 may be attached to dams 420. Wafer 418 may be attached to dams 420 such that each sensor die is attached to two dams, with one dam on each side of the sensor die. Wafer 418 may be attached to the dams using adhesive, glue, epoxy, polymer, or any other desired material. At step 406, wafer 418 has yet to be separated into individual sensor dies. In certain embodiments, dams 420 may be formed from an adhesive material. In embodiments where dams 420 are formed from an adhesive material, the transparent substrate may be attached to the dams without using an additional material. Similarly, the sensor dies may be attached to the dams without using an additional material.

At step 408, wafer 418 and notched substrate 417 may be separated to form sensor dies 426 and 428 which each are attached to a separate portion of notched substrate 417. For example, sensor die 426 may be attached to portion 437 of notched substrate 417 and sensor die 428 may be attached to portion 438 of notched substrate 417. After being separated, substrate portions 437 and 438 may be attached to panel 429. Sensor dies 426 and 428 and substrate portions 437 and 438 may be separated by sawing, cutting, or any other desired method. As shown in FIG. 6, substrate 417 may be cut at a notched portion with a thickness 442. The smaller thickness at the notched portion makes cutting substrate 417 easier. Panel 429 may be temporarily attached to substrate portions 437 and 438. Panel 429 may be made of a polymer or any other desired material. Depending on the process, panel 429 may be in wafer form or panel form.

At step 410, a molding process may be performed to fill in the gaps between the sensor dies. Mold 430 may fill in the gap between sensor dies 426 and 428 and may fill the areas to the sides of sensor dies 426 and 428. Similarly, mold 430 may fill in the gap between substrate portions 437 and 438 and may fill the areas to the sides of substrate portions 437 and 438. As shown in FIG. 6, sensor die 426 may have a side closest to substrate 437 that is attached to dams 420. The side that is furthest from substrate 437, which may subsequently be referred to as the top surface, may be left exposed during the molding process. Consequently, the portions of vias 424 on the top surface may also be left exposed during the molding process. Dams 420 may prevent mold 430 from reaching pixel arrays 422.

The molding process at step 410 may consist of dispensing a liquid compound, compression molding, or any other desired molding process. In embodiments where a liquid compound is used for the molding, the liquid compound may be poured in between each sensor die. The liquid compound may fill in all areas without penetrating through dams 420. The liquid compound may later be cured to provide a hermetic seal that prevents outside materials from reaching pixel array 422. In embodiments where compression molding is used, a mold material such as plastic may be heated at a suitable temperature for a suitable length of time. The mold material may then be compressed in between sensor dies and left to cure, effectively providing a hermetic seal in between the sensor dies.

At step 412, vias 424 may be provided with redistribution layers 425. While vias may extend vertically through dies 426 and 428, redistribution layers 425 may be conductive layers that connect to vias 424 and extend horizontally across the top surface of dies 426 and 428. Redistribution layers 425 may extend horizontally past the edge of dies 426 and 428 and onto mold 430. Redistribution layers 425 may be formed with a seed layer of conductive material such as a metal. The seed layer may be titanium, titanium-tungsten, copper, or any other desired conductive material. Redistribution layers 425 may then have a conductive material such as a metal plated on the seed layer. The plated conductive material may be copper, nickel, aluminum, or any other desired conductive material. Redistribution layers 425 may extend the amount of area available for forming solder connections. Redistribution layers 425 may have solder pads for forming solder connections. The solder pads may be tin-lead plated copper pads, silver plated copper pads, gold plated copper pads, or any other desired type of solder pad.

At step 414, solder 434 may be formed on redistribution layers 425. Solder balls 434 are formed on the top surface of silicon dies 426 and 428. In certain embodiments, solder balls 434 may be used to electrically connect vias 424 to bond pads on a printed circuit board. Solder balls 434 may be located on solder pads on redistribution layers 425.

At step 416, panel 429 may be removed. Panel 429 may be removed using any desired process. Mold 430 may then be cut to separate dies 426 and 428. Image sensor package 436 may have opposing top and bottom surfaces with first and second opposing side surfaces connecting the top and bottom surfaces. In certain embodiments, only one cut may be made in between sensor dies 426 and 428. In these embodiments, the bottom surface of image sensor package 436 may have portions formed from substrate portion 437 and portions formed from mold material 430. The top surface of image sensor package 436 may be have portions that are formed from mold material 430, portions that are formed from redistribution layers 425, and portions that are formed from solder 434. The side surfaces may be formed entirely from mold material 430.

Figure 7:
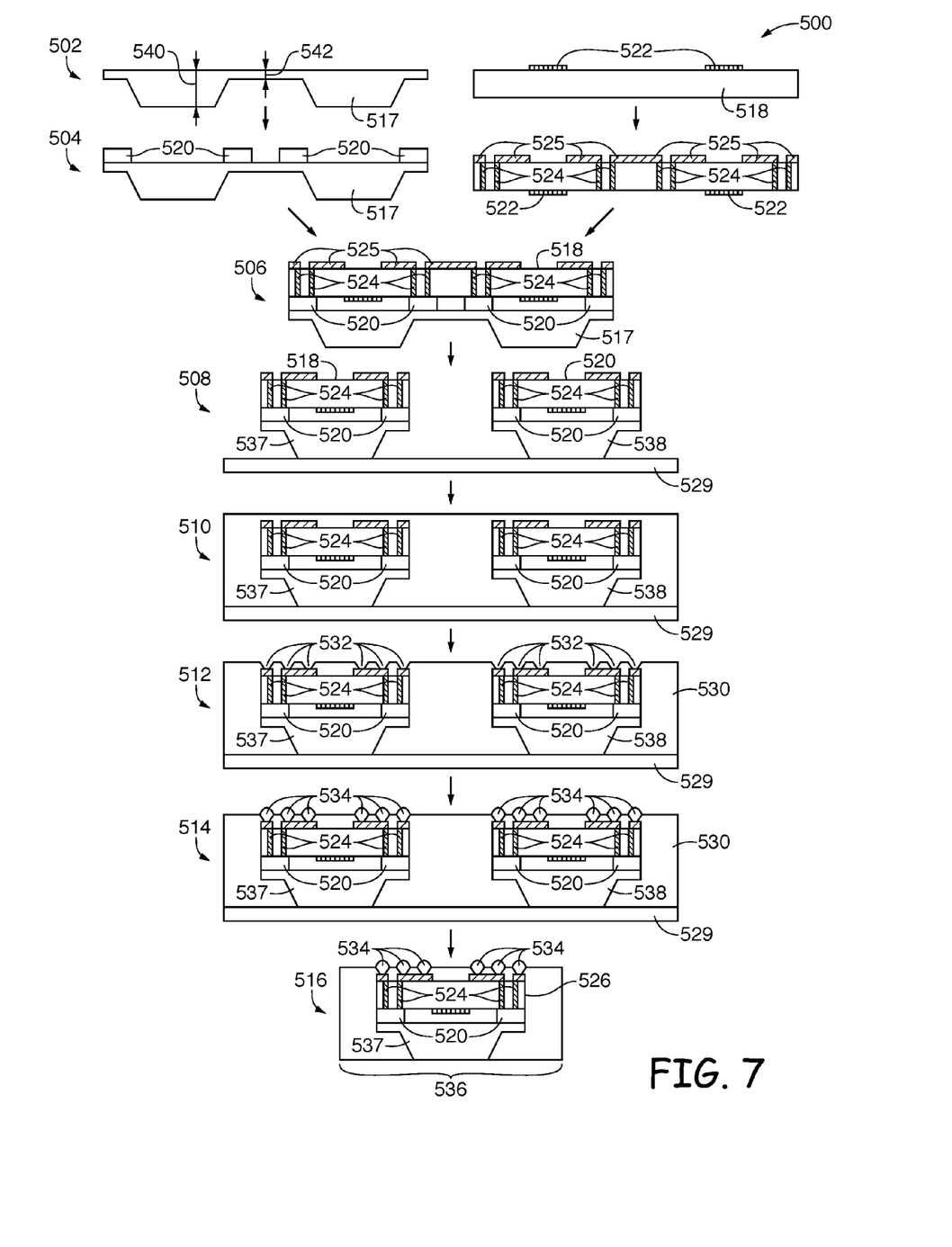
FIG. 7 is a cross-sectional diagram of an illustrative method for forming image sensor packages including using a notched substrate and a removable panel in accordance with an embodiment of the present invention.

FIG. 7 shows an illustrative method 500 for making image sensor packages including image sensors such as image sensor 16. At step 502, a notched substrate 517 and a wafer 518 may be provided. Wafer 518 may be made of silicon and may include one or more pixel arrays 522. Each pixel array may correspond to a different sensor. For example, a first pixel array may be used in a first image sensor such as sensor #1 in FIG. 2, and a second pixel array may be used in a second image sensor such as sensor #2 in FIG. 2. In FIG. 7, wafer 518 is shown with two pixel arrays, but this example is merely illustrative. Wafer 518 may have one pixel array, two pixel arrays, ten pixel arrays, hundreds of pixel arrays, or more than hundreds of pixel arrays. Wafer 518 may include an image sensor integrated circuit or multiple image sensor integrated circuits on the same side of the wafer as pixel arrays 522. Depending on the process, notched substrate 517 may be in wafer form or panel form.

Notched substrate 517 may be formed from a transparent glass sheet, a clear plastic layer, or other suitable transparent member. If desired, notched substrate 517 may be non-transparent or may be only partially transparent. For example, notched substrate 517 may transmit certain ranges of wavelengths while blocking other ranges of wavelengths, if desired. In arrangements where image sensor 16 is used for analyzing fluids (e.g., for capturing images of a substance during a photochemical reaction), it may desirable for notched substrate 517 to be completely or partially opaque (as an example). In general, notched substrate 517 may have any desired transmission spectrum. Arrangements where notched substrate 517 is transparent are sometimes described herein as an illustrative example.

Notched substrate 517 may have a first thickness 540 at the portions without notches. Notched substrate 517 may have a second thickness 542 at the notched portions. The second thickness may be less than the first thickness. The first and second thicknesses may be less than a micron, less than a millimeter, less than a centimeter, greater than a centimeter, or any other desired thickness. The notches in notched substrate 417 may be formed by wet etching, dry etching, a laser grooving process or any other desired process.

At step 504, dams 520 are attached to notched substrate 517. Dams 420 may be attached to notched substrate 517 using any desired methods or materials. For example, dams 520 may be attached to notched substrate 517 using adhesive, glue, epoxy, polymer, or any other desired material. Also at step 504, vias 524 may be formed in wafer 518. Vias 524 may provide a vertical electrical connection that passes completely through wafer 518. In embodiments where wafer 518 is made of silicon, vias 524 may be known as through-silicon vias (TSV). Vias 524 may be electrically connected to an image sensor integrated circuit.

At step 504, vias 524 may be provided with redistribution layers 525. While vias 524 may extend vertically through waver 518, redistribution layers 525 may be conductive layers that connect to vias 524 and extend horizontally across the top surface of wafer 518. Redistribution layers 525 may be formed with a seed layer of conductive material such as a metal. The seed layer may be titanium, titanium-tungsten, copper, or any other desired conductive material. Redistribution layers 525 may then have a conductive material such as a metal plated on the seed layer. The plated conductive material may be copper, nickel, aluminum, or any other desired conductive material. Redistribution layers 525 may extend the amount of area available for forming solder connections. Redistribution layers 525 may have solder pads for forming solder connections. The solder pads may be tin-lead plated copper pads, silver plated copper pads, gold plated copper pads, or any other desired type of solder pad.

Dams 520 may be formed from any desired material and have any desired dimensions. In FIG. 7, notched substrate 517 is shown with four attached dams. This example is merely illustrative. Notched substrate 517 may be attached to one dam, two dams, ten dams, hundreds of dams, or more than hundreds of dams. Substrate 517 may be attached to any desired number of dams for each sensor die in wafer 518. For example, substrate 517 may be attached to two dams for each sensor die in wafer 518.

At step 506, wafer 518 may be attached to dams 520. Wafer 518 may be attached to dams 520 such that each sensor die is attached to two dams, with one dam on each side of the sensor die. Wafer 518 may be attached to the dams using adhesive, glue, epoxy, polymer, or any other desired material. At step 506, wafer 518 has yet to be separated into individual sensor dies. In certain embodiments, dams 520 may be formed from an adhesive material. In embodiments where dams 520 are formed from an adhesive material, the transparent substrate may be attached to the dams without using an additional material. Similarly, the sensor dies may be attached to the dams without using an additional material.

At step 508, wafer 518 and notched substrate 517 may be separated to form sensor dies 526 and 528 which each are attached to a separated portion of notched substrate 517. For example, sensor die 526 may be attached to portion 537 of notched substrate 517 and sensor die 528 may be attached to portion 538 of notched substrate 517. After being separated, substrate portions 537 and 538 may be attached to panel 529. Sensor dies 526 and 528 and substrate portions 537 and 538 may be separated by sawing, cutting, or any other desired method. As shown in FIG. 7, substrate 517 may be cut at a notched portion with a thickness 542. The smaller thickness at the notched portion makes cutting substrate 517 easier. Panel 529 may be temporarily attached to substrate portions 537 and 538. Panel 529 may be made of a polymer or any other desired material. Depending on the process, panel 529 may be in wafer form or panel form.

At step 510, a molding process may be performed to encapsulate the sensor dies and fill in the gaps between the sensor dies. Mold 530 may fill in the gap between sensor dies 526 and 528 and may fill the areas to the sides of sensor dies 526 and 528. Similarly, mold 530 may fill in the gap between substrate portions 537 and 538 and may fill the areas to the sides of substrate portions 537 and 538. As shown in FIG. 6, sensor die 526 may have a side closest to substrate 537 that is attached to dams 520. The side that is furthest from substrate 537, which may subsequently be referred to as the top surface, may be entirely covered by mold 530 during the molding process. Similarly, the redistribution layers 525 may be entirely covered by mold 530 during the molding process. The mold may have a planar top surface after step 510. Dams 520 may prevent mold 530 from reaching pixel arrays 522.

The molding process at step 510 may consist of dispensing a liquid compound, compression molding, or any other desired molding process. In embodiments where a liquid compound is used for the molding, the liquid compound may be poured in between each sensor die. The liquid compound may fill in all areas without penetrating through dams 520. The liquid compound may later be cured to provide a hermetic seal that prevents outside materials from reaching pixel array 522. In embodiments where compression molding is used, a mold material such as plastic may be heated at a suitable temperature for a suitable length of time. The mold material may then be compressed in between sensor dies and left to cure, effectively providing a hermetic seal in between the sensor dies.

At step 512, mold vias 532 may be formed on the top surface of mold 530. The mold vias 532 may expose solder pads on the top surfaces of the redistributed layers 525. Mold vias 532 may be formed using a laser drilling process or any other desired process. In the laser drilling process, a laser is used to make vias 532 in mold 530.

At step 514, solder 534 may be formed in mold vias 532 on redistribution layers 525. Solder balls 534 are formed on the top surface of silicon dies 526 and 528. In certain embodiments, solder balls 534 may be used to electrically connect through-silicon vias 524 to bond pads on a printed circuit board. Solder balls 534 may be located on solder pads on redistribution layers 525.

At step 516, panel 529 may be removed. Panel 529 may be removed using any desired process. Mold 530 may then be cut to separate dies 526 and 528. Image sensor package 536 may have opposing top and bottom surfaces with first and second opposing side surfaces connecting the top and bottom surfaces.

In certain embodiments, image sensor package 536 may be diced such that no molding material remains on the left and right sides of sensor die 526 or substrate portion 537. In these embodiments, the bottom surface of image sensor package 536 may have portions formed from substrate portion 537 and portions formed from mold material 530. The top surface of image sensor package 536 may be have portions that are formed from mold material 530 and portions that are formed from solder 534. The side surfaces of image sensor package 536 may have portions that are formed from substrate 537, portions that are formed from dams 520, portions that are formed from sensor die 526, portions that are formed from redistribution layers 525, and portions that are formed from mold material 530.

In certain embodiments, only one cut may be made in between sensor dies 526 and 528 (e.g., FIG. 7). In these embodiments, the bottom surface of image sensor package 536 may have portions formed from substrate portion 537 and portions formed from mold material 330. The top surface of image sensor package 536 may be have portions that are formed from mold material 530 and portions that are formed from solder 534. The side surfaces may be formed entirely from mold material 530.

Figure 8:
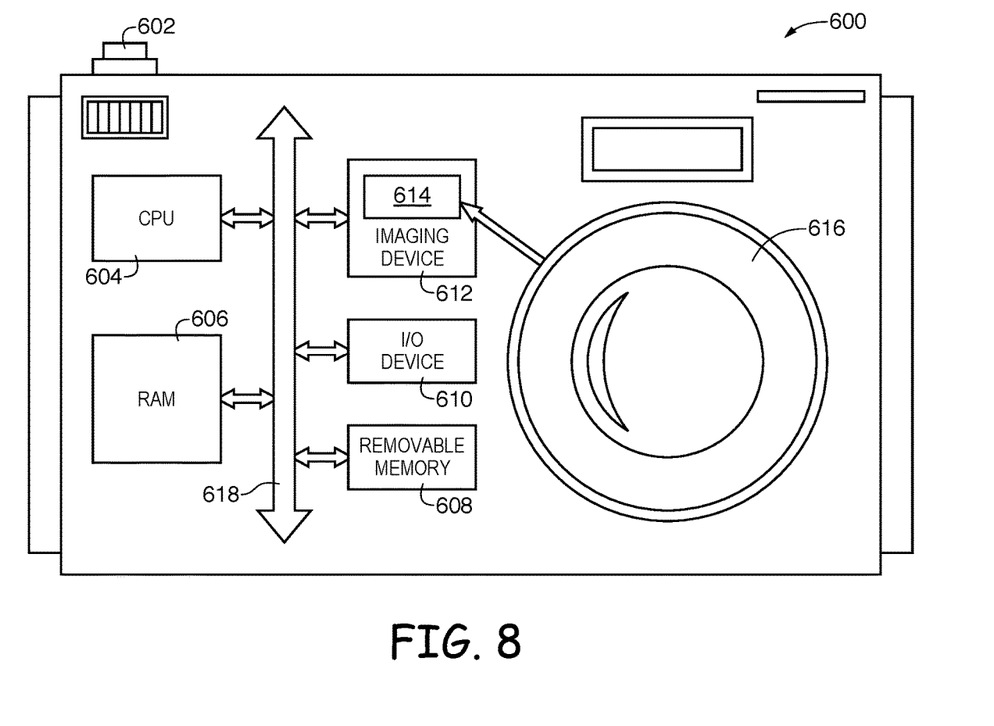
FIG. 8 is a block diagram of an illustrative processor system employing the embodiments of FIGS. 1-7 in accordance with an embodiment of the present invention.

FIG. 8 shows in simplified form a typical processor system 600 which includes an imaging device 612. Imaging device 612 may include a pixel array 614 formed on an image sensor package such as image sensor package 136, image sensor package 236, image sensor package 336, image sensor package 436, or image sensor package 536.

Without being limiting, such processor system 600 may include a computer system, still or video camera system, scanner, machine vision, vehicle navigation, video phone, surveillance system, auto focus system, star tracker system, motion detection system, image stabilization system, and other systems employing an imaging device.

Processor system 600, which may be a digital still or video camera system, may include a lens such as lens 616 for focusing an image onto a pixel array such as pixel array 614 when shutter release button 602 is pressed. Processor system 600 may include a central processing unit such as central processing unit (CPU) 604. CPU 604 may be a microprocessor that controls camera functions and one or more image flow functions and communicates with one or more input/output (I/O) devices 610 over a bus such as bus 618. Imaging device 612 may also communicate with CPU 604 over bus 618. System 600 may include random access memory (RAM) 606 and removable memory 608. Removable memory 608 may include flash memory that communicates with CPU 604 over bus 618. Although bus 618 is illustrated as a single bus, it may be one or more buses or bridges or other communication paths used to interconnect the system components.

Various embodiments have been described illustrating methods of forming image sensor packages. The method may including attaching a plurality of dam structures to a transparent substrate, forming a plurality of conductive vias in an image sensor wafer having first and second image sensor dies, attaching the image sensor wafer to the plurality of dam structures, separating the sensor wafer into the first and second image sensor dies after attaching the image sensor wafer to the plurality of dam structures, attaching the first and second image sensor dies to an additional substrate, and performing a molding process. Performing the molding process may include forming mold material on the additional substrate in between the first and second image sensor dies.

Attaching the image sensor wafer to the plurality of dam structures may include attaching the first image sensor die to first and second dam structures of the plurality of dam structures and attaching the second image sensor die to third and fourth dam structures of the plurality of dam structures. The first sensor die may be attached to a first portion of a transparent substrate and the second sensor die may be attached to a second portion of the transparent substrate. The first and second sensor dies may be attached to the additional substrate by attaching the first and second portions of the transparent substrate to the additional substrate. Forming mold material on the additional substrate may include forming mold material in between the first and second portions of the transparent substrate.

The method may also include removing the additional substrate after performing the molding process. After the additional substrate is removed, the first and second image sensor dies may be separated to form first and second image sensor packages. Separating the first and second image sensor dies may include cutting the mold material that is formed between the first and second image sensor dies.

The method may also include forming at least one conductive layer on a surface of the sensor wafer before attaching the sensor wafer to the plurality of dam structures. The at least one conductive layer may be electrically and mechanically connected to at least one conductive via of the plurality of conductive vias previously formed in the image sensor wafer. The transparent substrate may be a glass substrate, a notched transparent substrate, or a notched glass substrate. In embodiments where the transparent substrate is a notched transparent substrate and the notched transparent substrate is cut, the notched transparent substrate may be cut at a notch.

In certain embodiments, the method of forming image sensor packages may include attaching an attachment structure to a transparent substrate. The attachment structure may have first, second, third, and fourth portions. The method may also include forming a plurality of conductive vias in an image sensor wafer having first and second image sensor dies and forming at least one conductive layer on a surface of the image sensor wafer. The method may include attaching the first image sensor die to the first and second portions of the attachment structure and attaching the second image sensor die to the third and fourth portions of the attachment structure after forming the at least one conductive layer on the surface of the image sensor wafer. A molding process may be performed that includes forming mold material in between the first and second image sensor dies. The top surface of the mold material may cover the at least one conductive layer and the surface of the image sensor wafer.

The method may also include forming at least one hole in the top surface of the mold to expose the at least one conductive layer that exposes a solder pad on the at least one conductive layer and forming solder in the at least one hole. Forming the at least one hole may be completed using laser drilling.

In certain embodiments, the method of forming image sensor packages may include attaching a first dam, a second dam, a third dam, and a fourth dam to a transparent substrate and forming a plurality of conductive vias in a sensor wafer that comprises first and second image sensor dies. Each of the first and second image sensor dies may have at least one conductive via of the plurality of conductive vias. The method may also include separating the first and second image sensor dies, attaching the first image sensor die to the first and second dam and attaching the second image sensor die to the third and fourth dams after separating the first and second image sensor dies, and performing a molding process. The molding process may include forming a mold material in between the first and second image sensor dies. The method may also include cutting the transparent substrate and the mold material to form first and second image sensor packages.

After performing the molding process, a plurality of conductive layers may be formed on the first and second image sensor dies. Each of the plurality of conductive layers may be electrically and mechanically connected to a respective one of the plurality of conductive vias. A passivation layer may be formed over the conductive layers. At least one of the conductive layers may extend onto the mold material in between the first and second image sensor dies.

The foregoing is merely illustrative of the principles of this invention and various modifications can be made by those skilled in the art. The foregoing embodiments may be implemented individually or in any combination.

What is claimed is:

1. A method of forming image sensor packages comprising:
   attaching a plurality of dam structures to a transparent substrate;
   forming a plurality of conductive vias in an image sensor wafer that comprises first and second image sensor dies, wherein each of the first and second image sensor dies has at least one conductive via of the plurality of conductive vias;
   separating the first and second image sensor dies;

after separating the first and second image sensor dies, attaching the first image sensor die to at least a first dam structure of the plurality of dam structures and attaching the second image sensor die to at least a second dam structure of the plurality of dam structures;

performing a molding process, wherein performing the molding process comprises forming a mold material in between the first and second image sensor dies;

after performing the molding process, forming a plurality of conductive layers on the first and second image sensor dies, wherein each of the plurality of conductive layers are electrically and mechanically connected to a respective one of the plurality of conductive vias, wherein forming the plurality of conductive layers on the first and second image sensor dies comprises forming at least one conductive layer that extends onto and directly contacts the mold material in between the first and second image sensor dies; and cutting the transparent substrate and the mold material to form first and second image sensor packages.

2. The method defined in claim 1, wherein the transparent substrate has first and second opposing surfaces, wherein attaching the plurality of dam structures to the transparent substrate comprises attaching the plurality of dam structures to the first surface of the transparent substrate, and wherein performing the molding process comprises forming the mold material in direct contact with the first surface of the transparent substrate.

3. The method defined in claim 1, further comprising:
forming a passivation layer over the plurality of conductive layers.

4. The method defined in claim 3, further comprising:
forming a plurality of solder balls on the plurality of conductive layers.

5. The method defined in claim 1, wherein performing the molding process comprises forming the mold material in between the at least first dam structure and the at least second dam structure.

6. The method defined in claim 1, wherein the plurality of conductive layers comprise a plurality of redistribution layers and wherein a first redistribution layer of the plurality of redistribution layers is in direct contact with a first conductive via of the plurality of conductive vias.

7. The method defined in claim 1, wherein a portion of the at least one conductive layer does not overlap the first image sensor die, and wherein the portion of the at least one conductive layer does not overlap the second image sensor die.

8. The method defined in claim 1, wherein separating the first and second image sensor dies comprises cutting through the image sensor wafer.

* * * * *